United States Patent [19]

Wu et al.

[11] Patent Number: 5,429,966
[45] Date of Patent: Jul. 4, 1995

[54] METHOD OF FABRICATING A TEXTURED TUNNEL OXIDE FOR EEPROM APPLICATIONS

[75] Inventors: Shye-Lin Wu, Nan-Tou; Chung-Len Lee; Tan-Fu Lei, both of Hsinchu, all of Taiwan

[73] Assignee: National Science Council, Taipei, Taiwan

[21] Appl. No.: 96,505

[22] Filed: Jul. 22, 1993

[51] Int. Cl.$^6$ .................................... H01L 21/265
[52] U.S. Cl. ................................ 437/43; 257/321; 437/977
[58] Field of Search .................. 437/43, 49, 48, 195, 437/233, 977; 257/321

[56] References Cited

U.S. PATENT DOCUMENTS

| | | | |
|---|---|---|---|
| 5,158,902 | 10/1992 | Hanada | 437/43 |
| 5,208,173 | 5/1993 | Yamada et al. | 437/43 |
| 5,219,774 | 6/1993 | Vaschë | 437/43 |
| 5,268,320 | 12/1993 | Holler et al. | 437/43 |

FOREIGN PATENT DOCUMENTS

WO9011621  3/1989  WIPO ..................... 437/43

OTHER PUBLICATIONS

Wolf, "Silicon Processing for the VLSI Era", vol. II, pp. 168-169, 1990.
Hiroshi Nozawa, et al—"An EEPROM Cell Using A Low Barrier Height Tunnel Oxide"—IEE Transactions on Electron Devices, vol. ED-33, No. 2 Feb. 1986-pp. 275-280.
Eiichi Suzuki, et al—"Hole and Electron Current Transport In Metal-Oxide-Nitride . . . "—IEEE Trans. Electron Devices, vol. 36, No. 6, pp. 1145-1149, Jun. 1989.
S. K. Lai, et al—"Comparison and Trends in Today's Dominant E$^2$ Technologies"—IEDM Tech. Dig., pp. 580-583, 1986.
Y. Fong, et al—"Oxides Grown On Textured Single--Crystal . . . "—Solid State Electronics, vol. 34, No. 11, pp. 1139-1141.
Christopher J. Hegarty, et al—"Enhanced Conductivity and Breakdown of Oxides . . . "—Solid State Electronics, vol. 34, No. 11, pp. 1207-1213, 1991.
Ming-yin Hao, et al—"Electrical Characteristics of Oxynitrides Grown on Textured Single-Crystal Silicon"—Appl. Phys., vol. 60, No. 4, 17 Jan. 1992-pp. 445-447.

Primary Examiner—Olik Chaudhuri
Assistant Examiner—Richard A. Booth
Attorney, Agent, or Firm—Ladas & Parry

[57] ABSTRACT

Disclosed is a thin textured tunnel oxide prepared by thermal oxidation of a thin polysilicon film on Si substrate. Due to the rapid diffusion of oxygen through grain boundries of the thin polysilicon film into the Si substrate and the enhanced oxidation rate at grain boundries, a textured Si/SiO$_2$ interface is obtained. The textured Si/SiO$_2$ interface results in localized high fields and causes a much higher electron injection rate. EEPROM memory cells having the textured Si/SiO$_2$ exhibit a lower electron trapping rate and a lower interface state generation rate even under high field operation.

7 Claims, 12 Drawing Sheets

METHOD OF FABRICATING A TEXTURED TUNNEL OXIDE FOR EEPROM APPLICATIONS

BACKGROUND OF THE INVENTION

The present invention relates to a method of fabricating a textured tunnel oxide for an EEPROM(Electrically-Erasable Programmable Read-Only Memory) used in the production of VLSI, and in particular to a thin textured tunnel oxide prepared by thermal oxidation of a thin polysilicon film on a Si substrate (TOPS).

Thin tunnel oxides ($\cong 100$ Å) or thick polyoxides (oxides grown on polysilicon, $\approx 600$ Å) are typically used as tunneling gate dielectrics for EEPROMs. High density EEPROMs require scaling down device dimensions and lowering programming voltage. However, to write and erase the EEPROM cell with a lower voltage, the electron conductions in tunnel oxide must be enhanced. Scaling down the thin tunnel oxides for lower voltage operation may result in limitations in defect density, retention due to stress-induced leakages, or charge leakage due to direct tunneling. For thick polyoxides which use the rough polysilicon/oxide interface as an efficient electron injector, the very large electron trapping rate and memory window closing due to electron trapping will limit their memory endurance. Moreover, the reduction in thickness does not provide a proportional reduction in the programming voltage, because the electric field enhancement factor will decrease with the scaling-down of the polyoxide thickness.

Recently, Nozawa et al. has reported that tunnel oxides with a lower barrier height ($\approx 1.8$ eV) could be obtained by thermally oxidizing the heavily implanted substrate ($\geq 10^{20}$ cm$^{-3}$) in a diluted H$_2$0 ambient(H$_2$.0+Ar)( H. Nozawa, N. Matsukawa, S. Morita, J.-I, Miyamoto and T. Iizuka, "EEPROM cell with HB oxide for VLSI," VLSI Symp. Tech. Dig., p42, 1984; H. Nozawa, N. Matsukawa, and S. Morita, "An EEPROM cell using a low barrier height tunnel oxide," IEEE Trans, Electron Devices, vol. ED-33, p275,1986). The barrier height lowering effect of tunnel oxides grown on the heavily-doped substrate was attributed to the asperities, traps and arsenic clusters at the Si/SiO$_2$ interface. However, more recently, Hegarty et al. indicated that thermal oxides grown on heavily-doped substrates would exhibit a very poor charge-to-breakdown($Q_{bd}$) characteristics($\leq 10^{-2}$ C/cm$^2$) and a very high electron trapping rate.( C. J. Hegarty, J. C. Lee, and C. Hu, "Enhanced conductivity and breakdown of oxides grown on heavily implanted substrate" Solid State Electron., vol. 34, p.1207, 1991).

Fong et al. has recently reported that thermal oxides ($\approx 230$ Å) grown on a textured single crystal silicon substrate(TSC oxide) could exhibit a remarkable field enhancement and concurrently possess good reliability and endurance characteristics ( Y. Fong, A. T. Wu, R. Moazzami, P. K. Ko, and C. Hu, "Oxides grown on textured single-crystal for low programming voltage non-volatile memory applications," IEDM Tech. dig. p. 889, 1987; Y. Fong, A. T. Wu, P. K. Ko, and C. Hu, "Oxides grown on textured single crystal silicon for enhanced conduction," Appl. Phys. Lett., vol.52, p 1139, 1988; Y. Fong, A. T. Wu, and C. Hu. "Oxides grown on textured single crystal silicon-dependence on process and application in EEPROMs," IEEE Trans. Electron Devices, vol. ED-37, p583, 1990). The TSC oxide exhibits a lower electron trapping rate than the thick polyoxide and better charge-to-breakdown($Q_{bd}$) characteristics than the normal oxide. However, the optimum texturization process must be performed by plasma etching or reactive ion etching(RIE) the As+ or Si+ implanted substrate through a sacrficial oxide, and the etched depth must be at least 500 Å to obtain a satisfactory $Q_{bd}$ value. Also, the field enhancement factor decreases as the TSC oxide thickness decreases( M. Y. Hao and J. C. Lee, "Electrical Characteristics of oxynitrides grown on textured single-crystal silicon" Appl. Phys. Lett., Vol 60, p.445, 1992).

SUMMARY OF THE INVENTION

It is therefore an object of the present invention to provide a method of fabricating a thin textured tunnel oxide that is not subjected to the drawbacks mentioned above.

It has been found by the inventors of the present invention that an ultra-thin textured tunnel oxide($\leq 100$ Å ) can be prepared by thermally oxidizing a thin polysilicon film on a silicon substrate(TOPS). Due to the rapid diffusion of oxygen through the grain boundaries of the polysilicon film into the Si substrate and the enhanced oxidation rate at the grain boundries, a textured Si/SiO$_2$ interface is obtained. The textured interface results in localized high fields and enhances the electron injection into TOPS. Hence, the TOPS sample exhibits a much higher electron conduction efficiency and a much lower electron trapping rate, and a much larger value of $Q_{bd}$ as compared to normal tunnel oxides, in spite of the substrate doping level.

Specifically, according to an exemplified method of the present invention, the textured tunnel oxide is formed by thermally oxidizing a thin amorphous silicon layer deposited on a n-type silicon substrate. A textured Si/SiO$_2$ interface is formed between the n-type silicon substrate and the oxidized layer. The thickness of the amorphous silicon layer ranges from 2 nm to 15 nm.

The invention also provides a method of fabricating an EEPROM memory cell, comprising the steps of: (a) preparing a n-type silicon substrate; (b) depositing an amorphous silicon layer or a polysilicon layer on the n-type silicon substrate by using a LPCVD system; (c) thermally oxidizing the amorphous silicon layer with the polysilicon layer to form a tunnel oxide layer; and (d) depositing a polysilicon layer on the tunnel oxide layer. Preferably, the polysilicon can be deposited and oxidized, or amorphous silicon can be deposited, heated so as to crystalize into polysilicon, and thereafter oxidized.

BRIEF DESCRIPTION OF THE DRAWINGS

The present invention can be more fully understood by reading the subsequent detailed description of the preferred embodiments and examples thereof with references made to the accompanying drawings, wherein:

FIG. 5b shows the corresponding $Jg/Eox^2$ versus 1/Eox plots of TOPS and normal oxide capacitors as shown in FIG. 5a;

FIG. 9a shows the $Q_{bd}$ histograms of the TOPS and normal oxide capacitors shown in FIG. 5a;

DETAILED DESCRIPTION OF THE INVENTION

Figure 1:
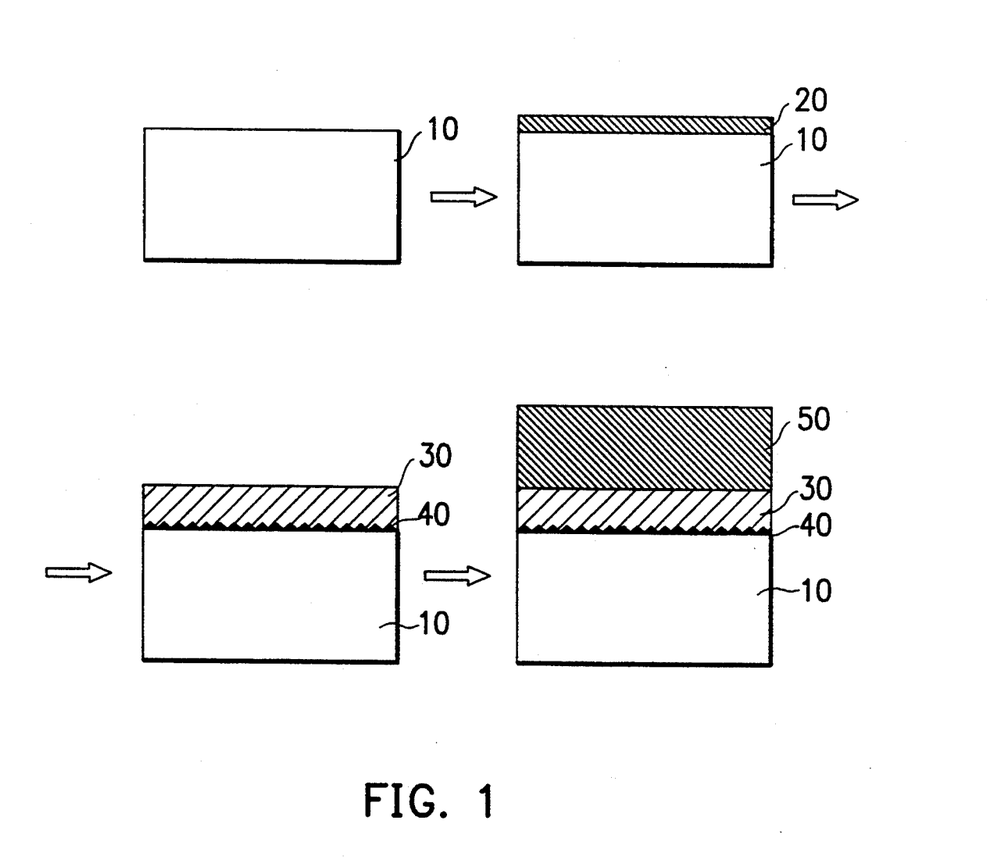
FIG. 1 is a schematic diagram showing the steps of fabricating the textured tunnel oxide by the method of the present invention.

Referring now to FIG. 1, which shows a schematic diagram for fabricating the textured tunnel oxide by the method of the present invention, to fabricate the textured tunnel oxide 30, an amorphous silicon film 20 is deposited on a n-type silicon wafer 10 by using an LPCVD system, and then the amorphous silicon film 20 is thermally oxidized. Consequently, a textured (rough) SiO₂/Si interface 40 is formed between silicon wafer 10 and tunnel oxide 30. A polysilicon layer 50 is further deposited on the textured tunnel oxide 30 to be used as the floating gate.

EXAMPLE n-type silicon wafers having an ohmic resistance of 0.55–1.1 Ω-cm or 8–12 Ω-cm are prepared. Some wafers were doped by arsenic ion implantations at 80 keV with doses ranging from $5\times 10^{12}$ to $5\times 10^{15}$ $cm^{-2}$ through a 300Å Å pad oxide or at 100 keV with a dose of $5\times 10^{15}$ $cm^{-2}$ through a 500 Å pad oxide. Then all wafers were annealed at 900° C. for 40 minutes in an N₂ ambient to activate the dopants and to reduce the implant-induced damages. After removing the surface pad oxide, very thin amorphous silicon (α-Si) films (20 to 100 Å) were deposited on Si wafers at 550° C. by using a LPCVD system. The deposition rate and deposition pressure of α-Si film were controlled at about 20 Å/min and 150 mtorr respectively. After the α-Si film deposition, the wafers were loaded into a furnace at 600° C. in an N₂ ambient to reduce the thermal stress and minimize the native oxide growth. The temperature of the furnace was then gradually raised to 900° C. in an N₂ ambient. During the temperature ramp-up step, the α-si films were crystallized into polysilicon. Then, thin tunnel oxides (78 to 160 Å) were grown by thermal oxidation of the thin polysilicon films at 900° C. in a dry O₂ ambient. A LPCVD polysilicon film with a thickness of 3000 Å was immediately deposited and doped with a POCl₃ source to the sheet resistance of about 20 Ω/square to obtain the TOPS samples of the invention.

For comparison, normal oxides were made by thermally oxidizing the same n-type substrate under the same conditions as above. The obtained normal oxide has a similar thickness as that of the TOPS samples.

The characteristics of the thin textured tunnel oxide of the present invention and normal oxide were investigated and discussed hereunder, in which the effective oxide thickness of the TOPS samples was determined by the high-frequency C-V measurement (100 KHz), the morphologies of the Si/SiO₂ interface were examined with a transmission electron microscope (TEM), the I-V characteristics and time-to-dielectric-breakdown (TDDB) characteristics were measured by using an HP 4145B semiconductor parameter analyzer, and the C-V characteristics were measured by using the Keithley 590 and 595 C-V analyzers.

Figure 2A:
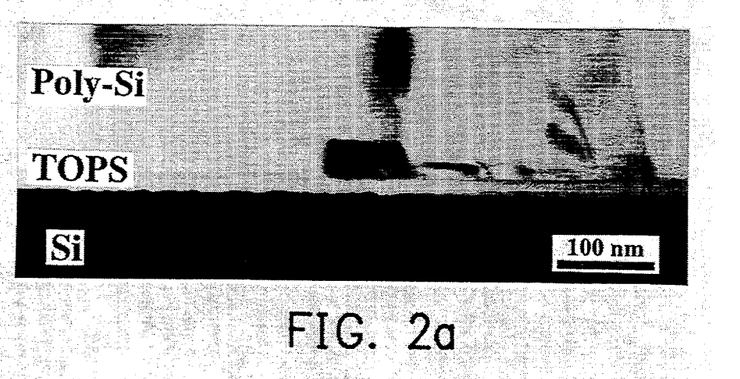
FIG. 2a is the TEM micrograph of the cross-sectional view of TOPS grown on an unimplanted silicon substrate.
Figure 2B:
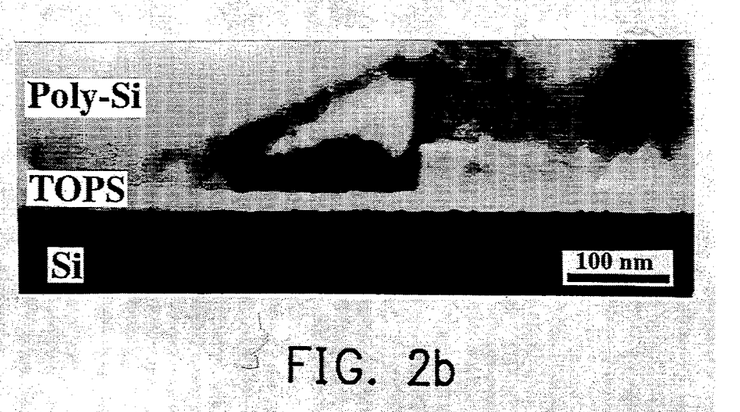
FIG. 2b is the TEM micrograph of the cross-sectional view of TOPS grown on a heavily implanted substrate.
Figure 2C:
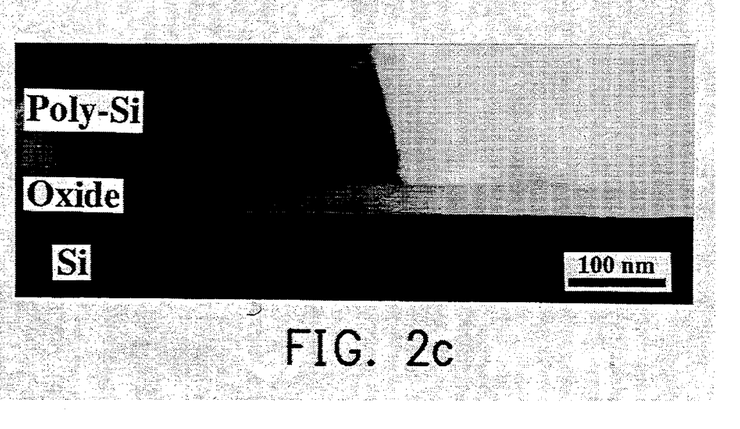
FIG. 2c is the TEM micrograph of the cross-sectional view of a normal oxide grown on a heavily implanted substrate.

FIG. 2a and FIG. 2b show the cross sectional TEM micrographs of the TOPS sample grown on the unimplanted substrate and heavily implanted substrate which was doped by arsenic implantation at 100 keV with a dose of $5\times 10^{15}$ $cm^{-2}$ respectively. FIG. 2c shows a similar TEM micrograph of the normal oxide grown on the heavily implanted substrate. The thickness of the stacked α-Si film was about 50 Å and the oxidation process was performed at 900° C. for 12.5 minutes in a dry O₂ ambient. As shown in FIG. 2a and FIG. 2b, a rough (textured) SiO₂/Si interface was formed regardless of the substrate doping level. However, for the normal oxide, as shown in FIG. 3c, the Si/SiO₂ interface is relatively smooth even when the substrate was heavily doped.

Figure 3:
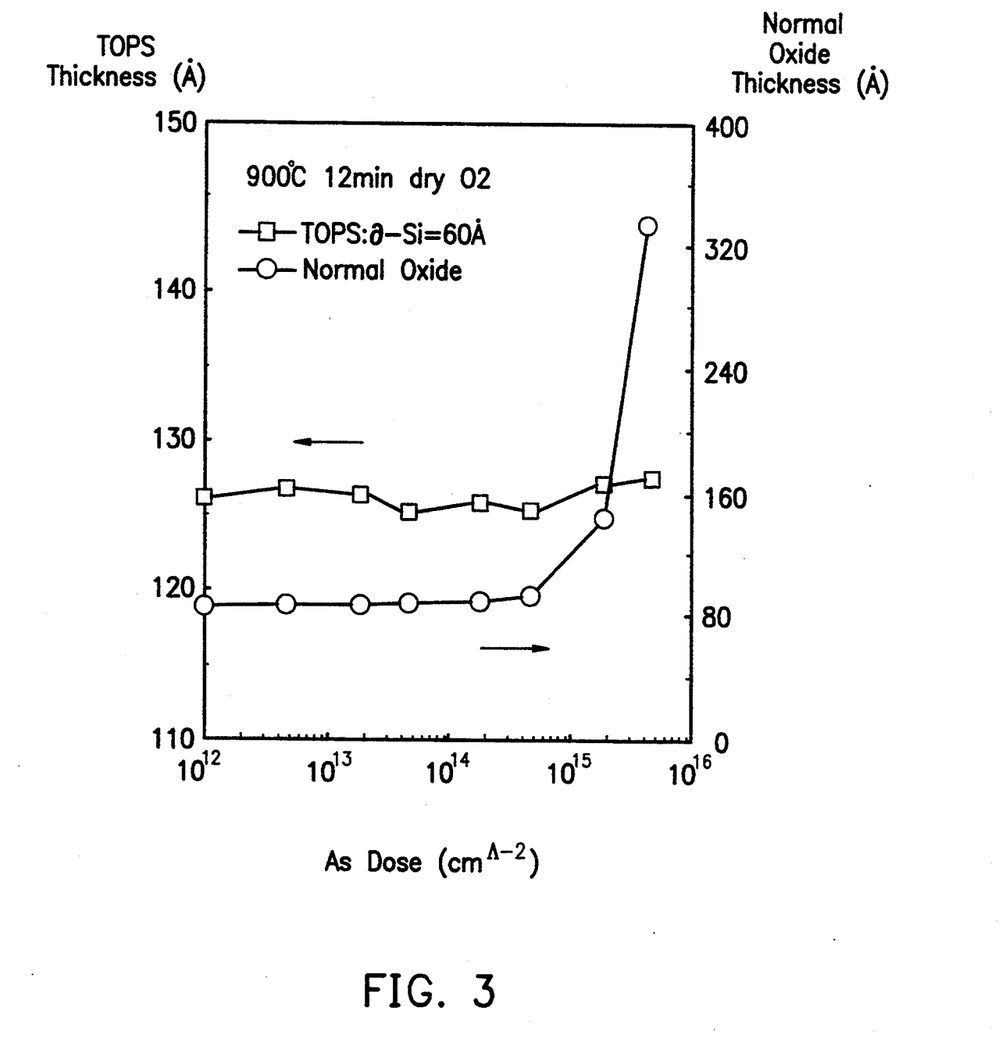
FIG. 3 are curves of the effective oxide thickness versus the implanted As dosages ranging from $1\times 10^{12}$ $cm^{-2}$ to $5\times 10^{15}$ $cm^{-2}$ of TOPS and normal oxide.

Referring now to FIG. 3, which shows the curves of the effective oxide thickness versus the implanted As dosage ranging from $1\times 10^{12}$ $cm^{-2}$ to $5\times 10^{15}$ $cm^{-2}$ of TOPS and normal oxide, the thickness of stacked α-Si was about 60 Å and the oxidation process was performed at 900° C. for 12 minutes in a dry O₂ ambient. It is seen that the effective oxide thicknesses of TOPS are larger than that of normal oxide until the implanted As dosage reaches $2\times 10^{15}$ $cm^{-2}$. However, the thickness of the normal oxide grown on the heavily As implanted substrate (As dose is $5\times 10^{15}$ $cm^{-2}$) is much larger than that of TOPS. It is noted that the oxidation rate is nearly independent of the substrate doping level. However, the oxidation rate of the normal oxide increases as the As implanted dosage exceeds $5\times 10^{15}$ $cm^{-2}$.

Figure 4:
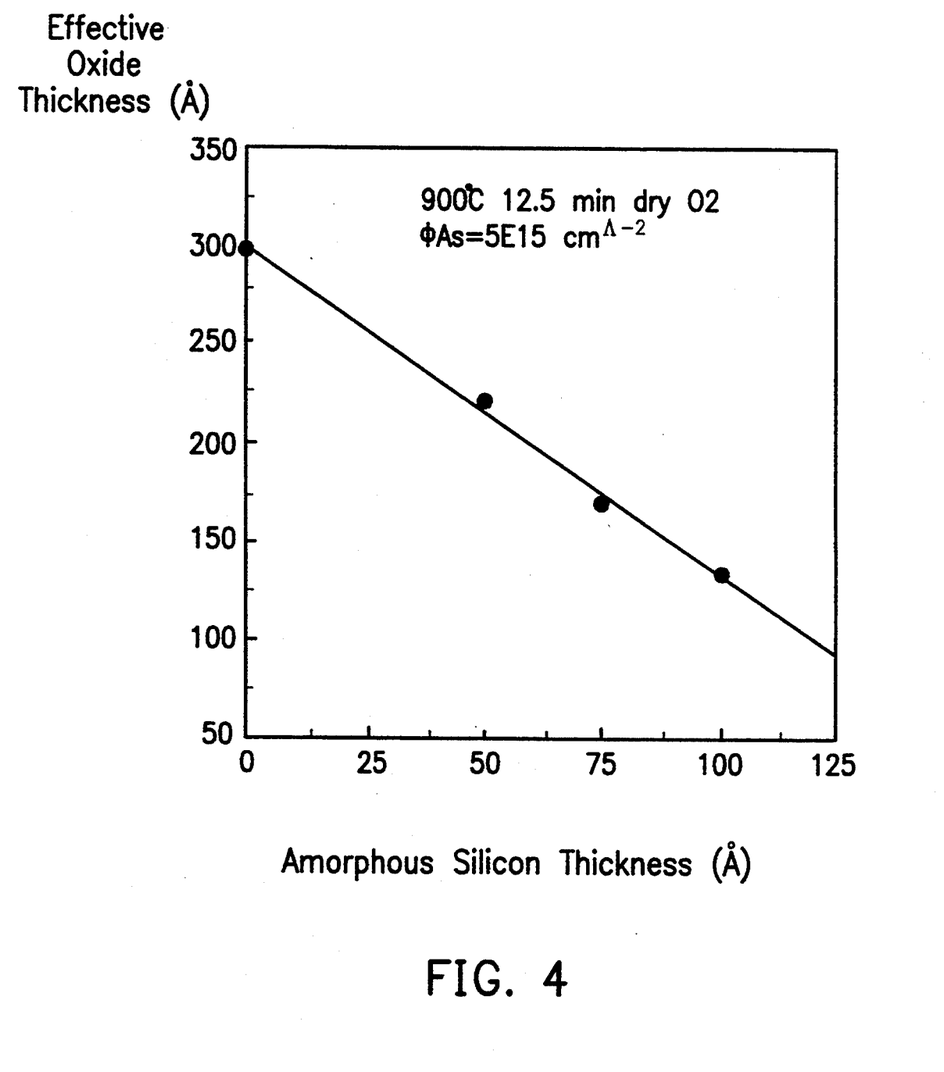
FIG. 4 shows the plot of the effective oxide thickness versus the stacked α-Si thickness of 0, 50, 75, and 100 Å for TOPS grown on a heavily doped substrate.

FIG. 4 shows the plot of the effective oxide thickness versus the stacked α-Si thickness of 0, 50, 75, and 100 Å for TOPS grown on a heavily doped substrate( i.e., As dose=$5\times 10^{15}$ $cm^{-2}$). Due to the heavy-doping-induced oxidation rate, the thickness of the normal heavily doped oxide is much larger than that of the TOPS samples. Assuming the rule that for the formation of an oxide layer of a thickness $d_o$, a thickness of 0.44 $d_o$ of the Si layer must be consumed can be applied to TOPS, then in FIG. 4, the TOPS sample with a stacked α-Si film of 50A Å thickness was overoxidized and the TOPS sample with a stacked α-di film of 100 Å thickness was underoxidized and the TOPS sample with a stacked α-Si film of 75A Å thickness was justly oxidized.

Figure 5A:
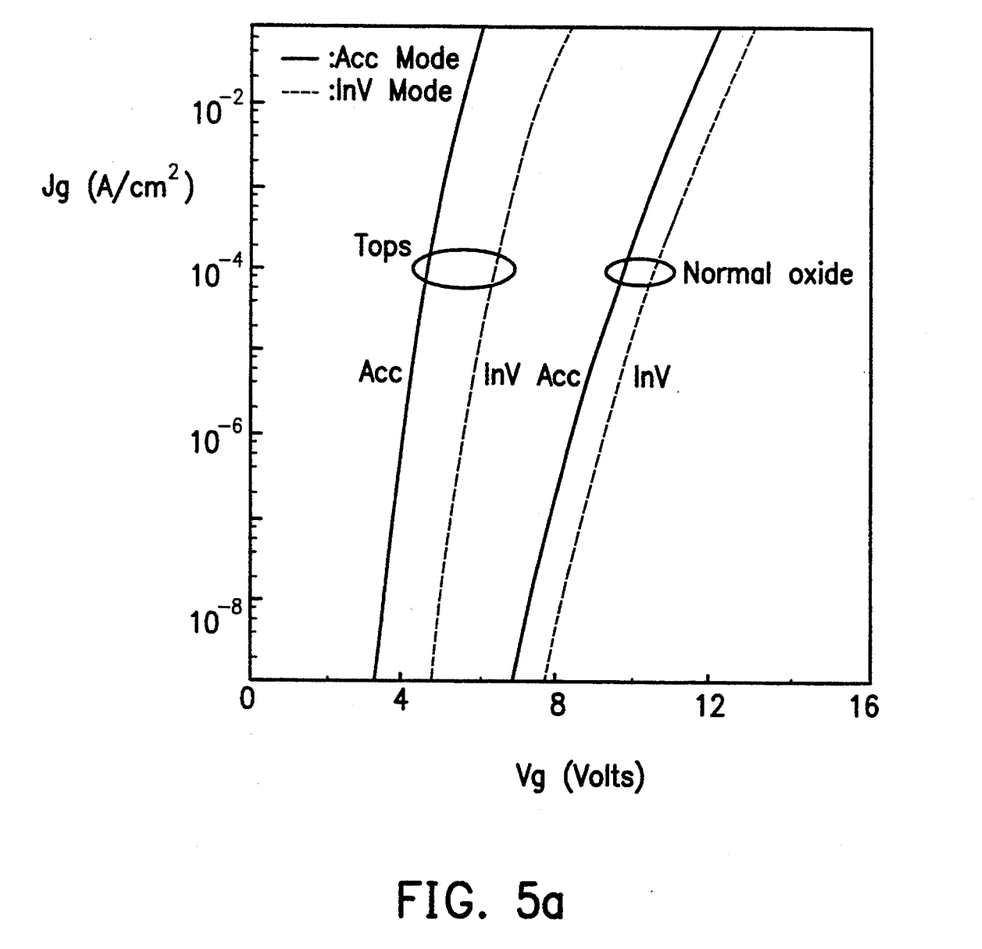
FIG. 5a is a diagram showing the accumulation mode and inversion mode Jg-Vg characteristics of TOPS and normal oxide capacitors with an effective oxide thickness of about 110 Å respectively.

FIG. 5a shows the accumulation mode and inversion mode Jg-Vg characteristics of the TOPS and normal oxide capacitors with an effective oxide thickness of about 110 Å respectively. The stacked α-Si thickness of the TOPS capacitor was about 50 Å. It is seen that the electron injection efficiency of the TOPS capacitor is much higher than that of the normal oxide capacitor for both the injection polarities. For example, at the current density of 10 mA/cm$^2$ of the accumulation mode Jg-Vg characteristics, which is the typical current density to rapidly charge the floating gate, the TOPS capacitor with the textured Si/SiO$_2$ interface reduces the gate voltage from 11.2 V for the normal oxide capacitor to 5.5 V. The enhanced electron injection efficiency is believed due to the localized high fields induced by the textured Si/SiO$_2$ interface.

As shown in FIG. 2a and FIG. 2b, the degree of the texturization of the bottom Si/SiO$_2$ interface is larger than that of the top Si/SiO$_2$ interface. Hence, as shown in FIG. 5a, the electron injection efficiency form the bottom interface into TOPS (accumulation mode) is greater than that from the top interface (inversion mode). That is, the effective electron barrier height $\phi_{bn}$ of the TOPS capacitor for electron injection from the bottom interface is less than that from the top interface.

Figure 5B:
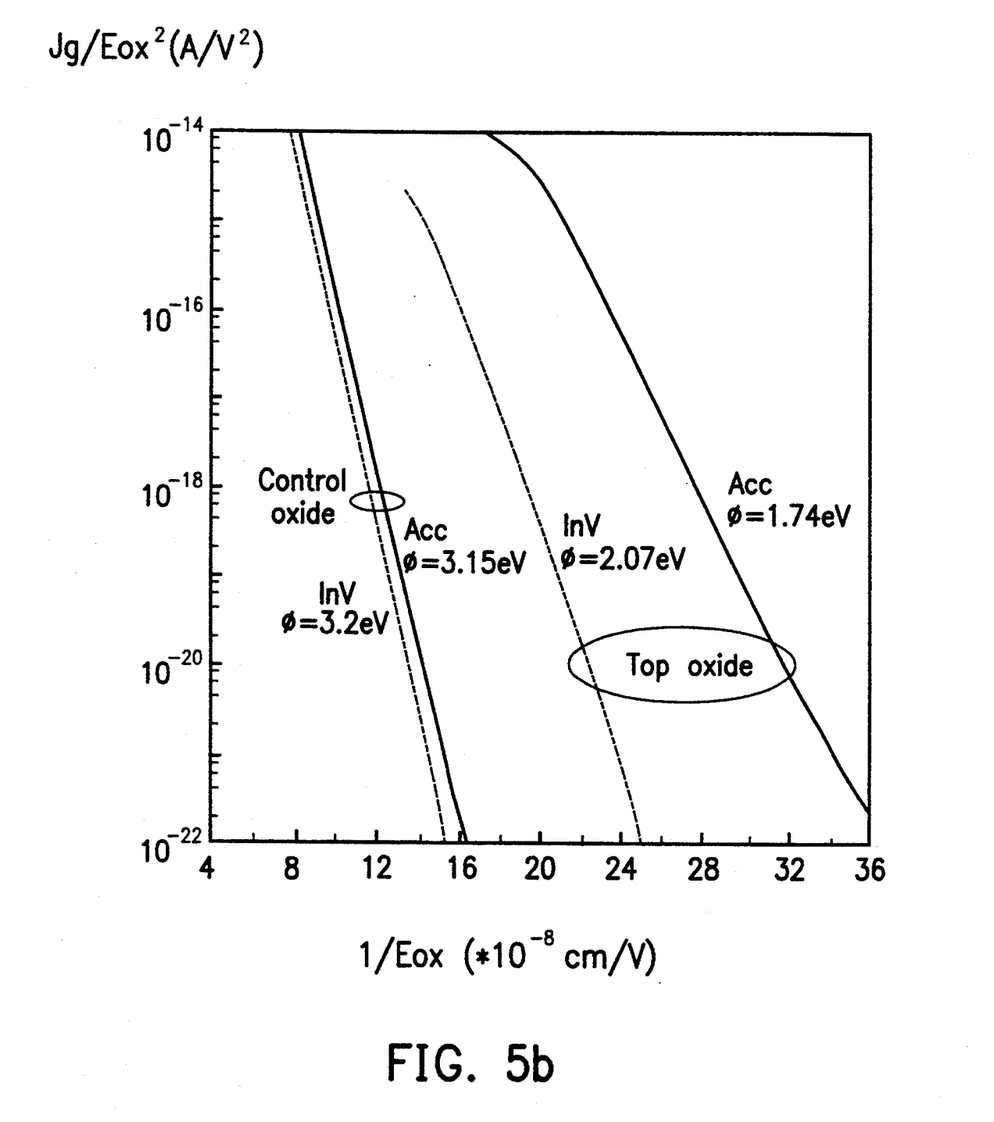

FIG. 5b shows the Jg/Eox$^2$ versus 1/Eox plots (Fowler-Nordheim, F-N plots) of the TOPS and normal oxide capacitors derived from FIG. 5a respectively. The deduced values of the effective electron barrier height, $\phi_{bn}$, in the accumulation mode Jg-Vg characteristics are about 1.74 and 3.15 eV for the TOPS and normal oxide capacitors respectively. In the inversion mode Jg-Vg characteristics, they are about 2.07 and 3.2 eV for the TOPS and normal oxide capacitors respectively.

Figure 6:
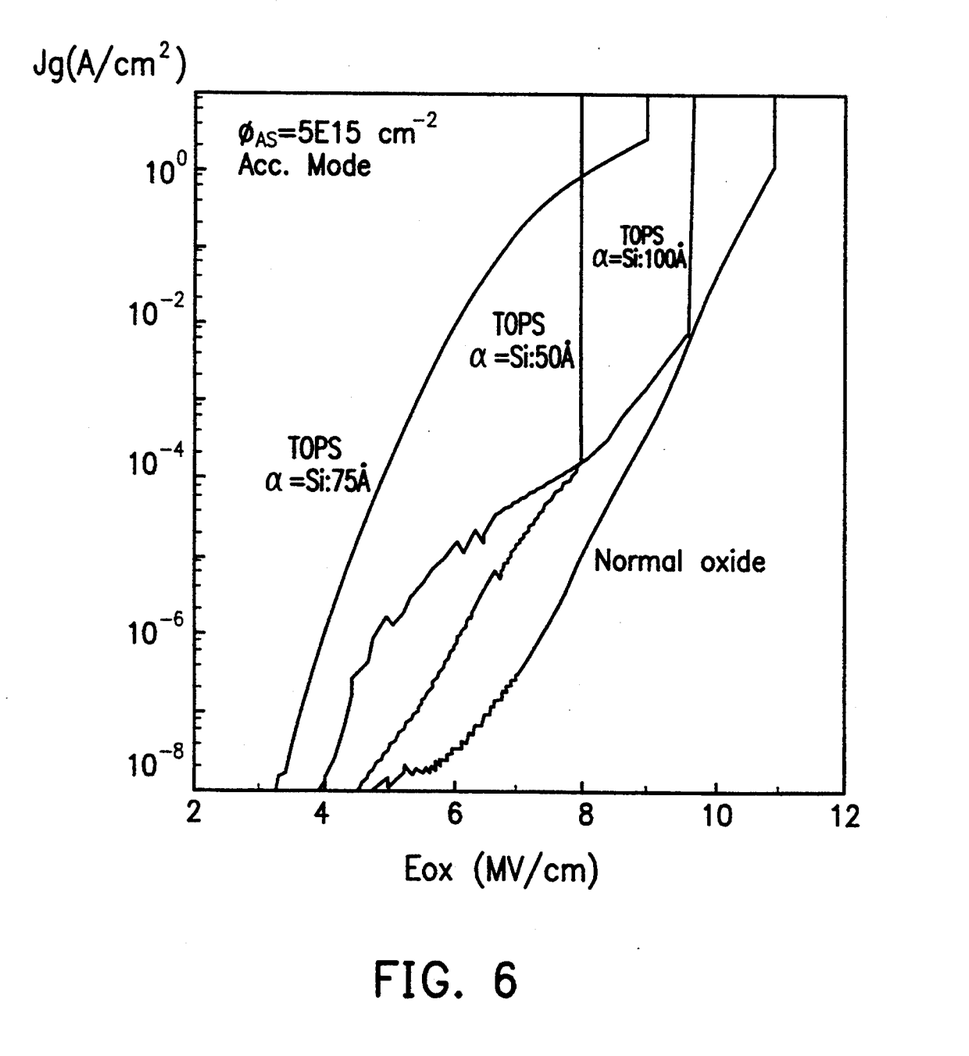
FIG. 6 shows the accumulation mode Jg-Eox characteristics of TOPS samples grown on the heavily doped substrate with four different stacked α-Si thicknesses of FIG. 4.

FIG. 6 shows the accumulation mode Jg-Eox characteristics of the TOPS samples grown on the heavily doped substrate with the four different stacked α-Si thicknesses of FIG. 4b. It is seen that the 160 Å thick TOPS sample formed by thermally oxidizing the 75 Å thick α-film has the greatest electron injection efficiency and the largest tunnelling current at the onset of dielectric breakdown. For the overoxidized and underoxidized TOPS samples, the Jg-Eox characteristics become anomalous and the tunneling current at the onset of dielectric breakdown is very small. Thus, we conclude that to obtain an optimum TOPS characteristics, the stacked α-si film must be justly converted into oxide.

Figure 7:
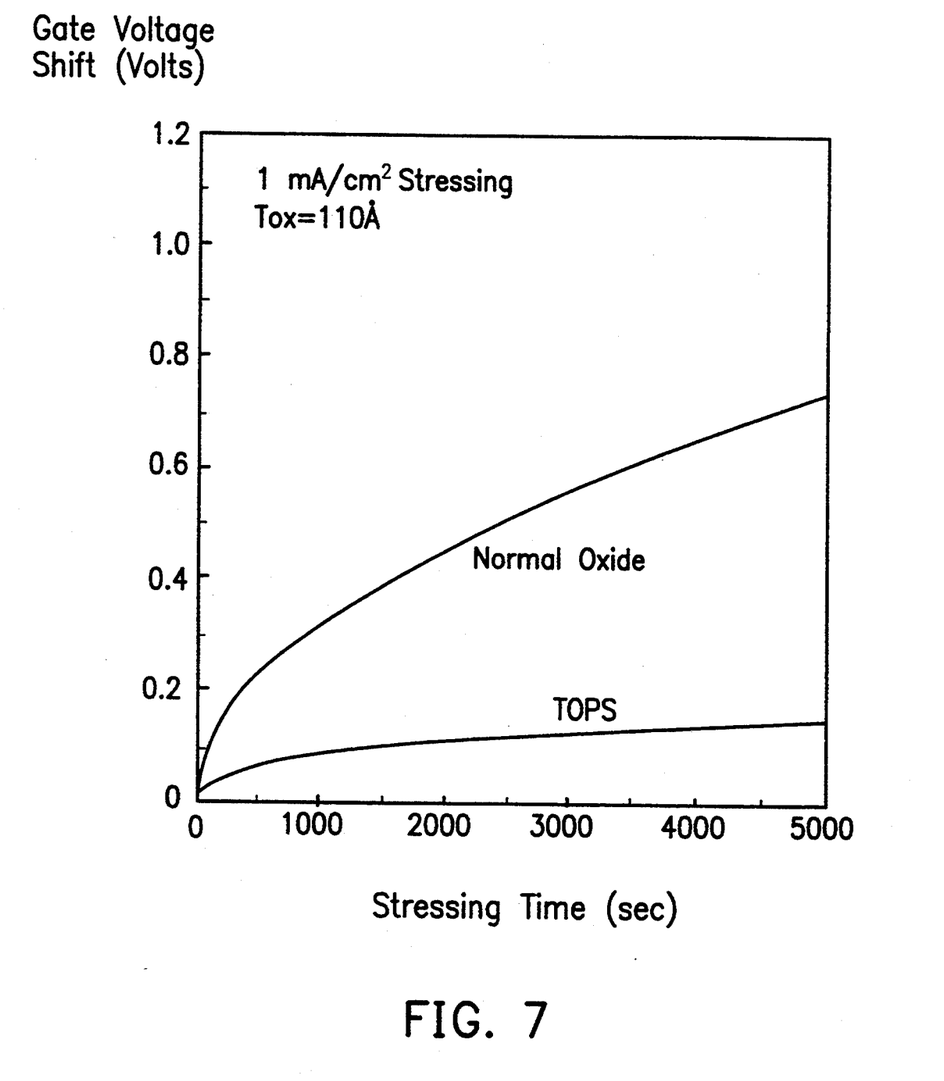
FIG. 7 shows the gate voltage shift ( Vg) versus the stressing time for the TOPS and the normal oxide capacitors of FIG. 5a under a constant current stressing of 1 mA/cm² for 5000 sec.

FIG. 7 shows the gate voltage shift ( Vg) versus time for TOPS and the normal oxide under a constant current stressing of 1 mA/cm$^2$ up to 5000 sec. It is seen that both oxides exhibit an electron trapping behavior, however, the TOPS exhibits a Vg 4 times lower than that of the normal oxide. This implies that TOPS has a better immunity to electron trapping under high field operation. This may be due to the fact that for TOPS, a lower bulk electric field existed which consequently generated less electron hole pairs as compared to the normal oxide. This lower bulk electric field feature further increases the stressing endurance of TOPS.

Figure 8:
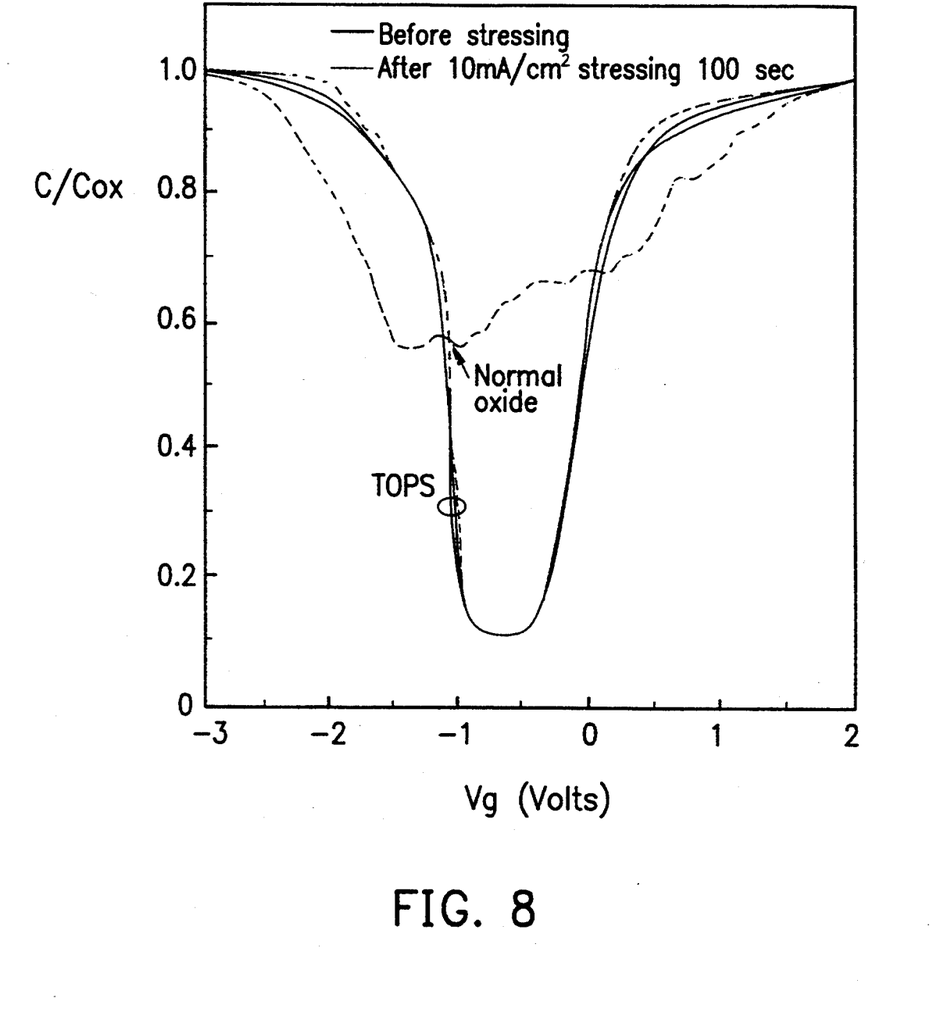
FIG. 8 shows the quasi-static C-V characteristics of the TOPS and normal oxide capacitors of FIG. 5a before and after 10 mA/cm² stressing for 100 sec.

FIG. 8 shows the quasi-static C-V characteristics of the TOPS and the normal oxide before and after a constant current of 10 mA/cm$^2$ stressing for 100 sec. For TOPS, there is no significant degradation in the C-V curves after stressing.

Figure 9A:
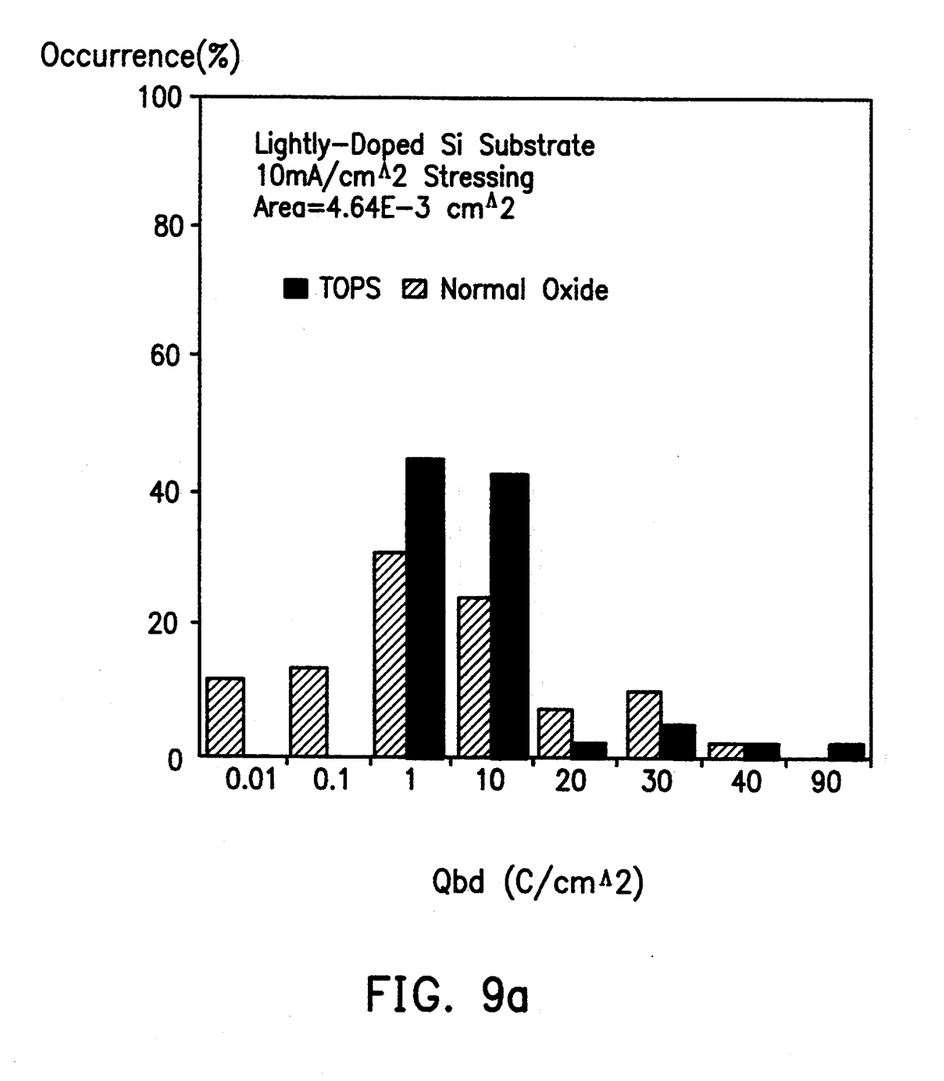

FIG. 9a shows the charge-to-breakdown (Qbd) histograms of the TOPS sample and the normal oxide of FIG. 5a. The area of the testing device is $4.64 \times 10^{-3}$ cm$^2$ and the stressing current is 10 mA/cm$^2$. It is seen that about 35% of the normal oxide capacitors have $Q_{bd}$ less than 1 C/cm$^2$, while nearly all the 100 TOPS capacitors have Qbd larger than 1 C/cm$^2$. Furthermore, more than 50% of the TOPS capacitors have $Q_{bd}$ larger than 10 C/cm$^2$.

Figure 9B:
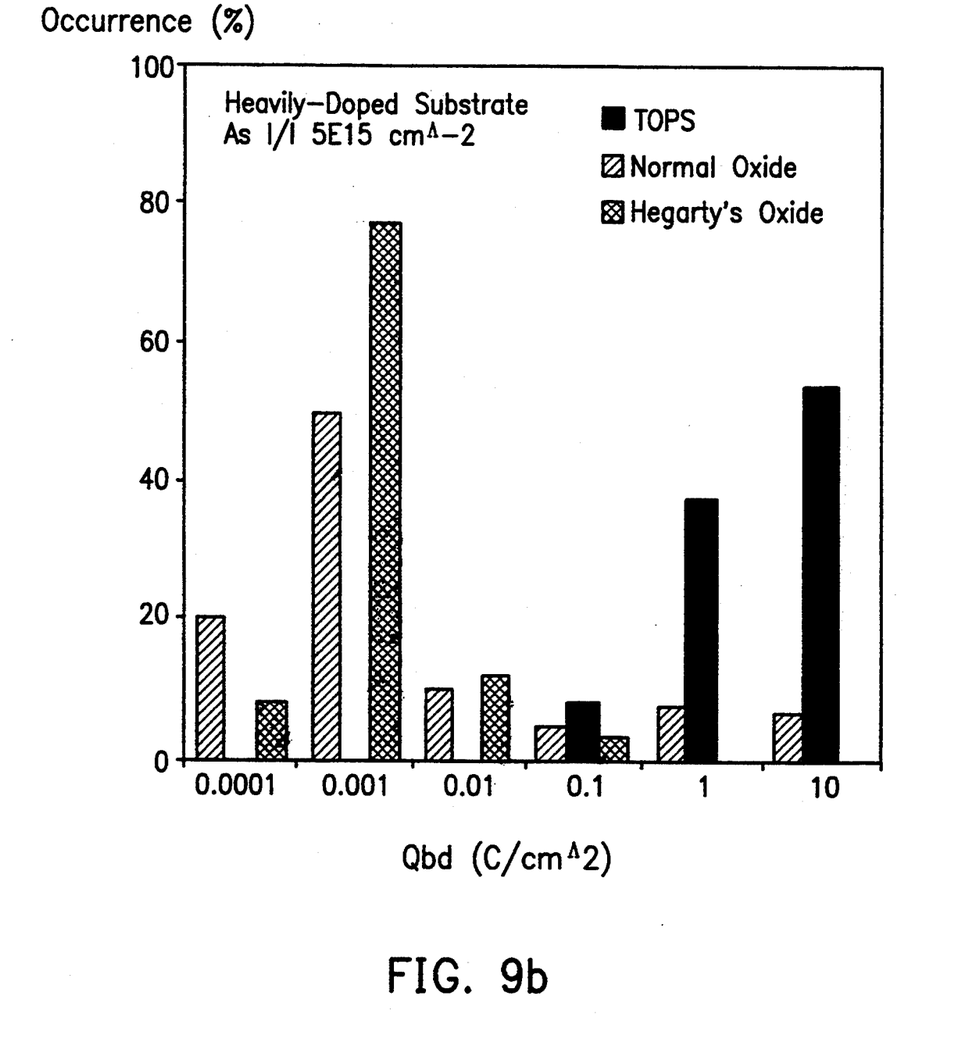
FIG. 9b shows the $Q_{bd}$ histograms of the TOPS sample and the normal oxide grown on the heavily doped substrate(i.e., As dose=$5\times 10^{15}$ $cm^{-2}$) under a constant of 10 mA/cm² stressing.

FIG. 9b shows the $Q_{bd}$ histograms of TOPS and normal oxide grown on the heavily doped substrate (As dose=$5 \times 10^{15}$ cm$^{-2}$). The area of the testing device is $2.6 \times 10^{-4}$ cm$^{-2}$ and the stressing current is 10 mA/cm$^2$. The $Q_{bd}$ histogram of the Hegarty's oxide is also shown in this figure for comparison( C. J. Hegarty, J. C. Lee, and C. Hu, "Enhanced conductivity and breakdown of oxides grown on heavily implanted substrate " solid State Electron., vol. 34, p. 1207, 1991). It is noted that none of the TOPS capacitors fall before 0.1 C/cm$^2$. The significant difference in $Q_{bd}$ may be explained by the lower bulk electric field for TOPS, which results in a reduction of the hole generation rate.

Figure 10:
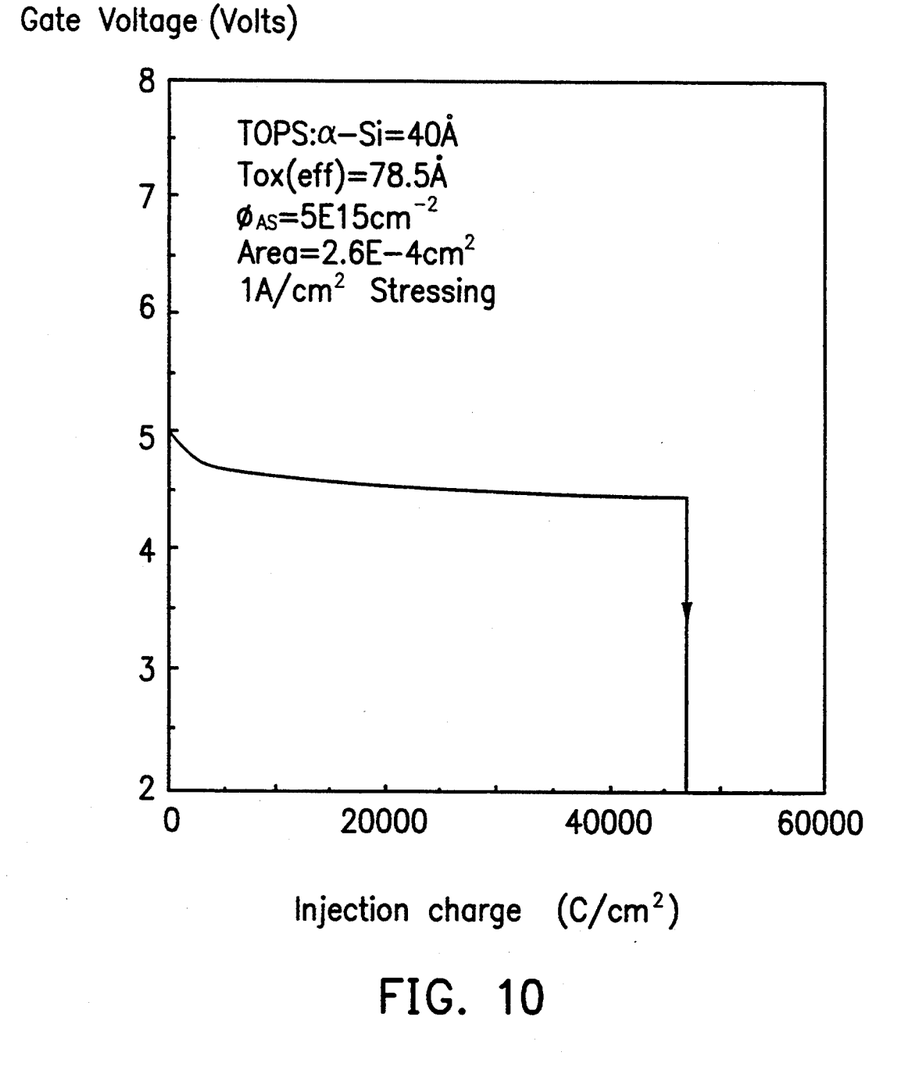
FIG. 10 shows the gate voltage shift versus the injection charge density under the optimal oxidation process for fabricating the textured tunnel oxide.

FIG. 10 shows the curve of the gate voltage shift versus the injection charge. The breakdown point occurs near 50,000 c/cm$^2$. Up to the present date, the best $Q_{bd}$ found in published technique papers is only about 200 C/cm$^2$ to 300 C/cm$^2$.

What is claimed is:

1. A method of fabricating an EEPROM memory cell, comprising a following steps:
   (a) preparing a n-type silicon substrate;
   (b) depositing an amorphous silicon layer or a polysilicon layer by low pressure chemical vapor deposition on the n-type silicon substrate;
   (c) thermally oxidizing the amorphous silicon layer or the polysilicon layer to form a tunnel oxide layer on the n-type silicon substrate, wherein a textured interface is formed between the n-type silicon substrate and the tunnel oxide layer; and
   (d) depositing a polysilicon layer on the tunnel oxide layer.

2. The method as claimed in claim 1, wherein the n-type silicon substrate is doped with the dose ranging from $1 \times 10^{12}$ cm$^{-2}$ to $1 \times 10^{16}$ cm$^{-2}$.

3. The method as claimed in claim 1, wherein in said step (b) the thickness of the amorphous silicon layer is in the range of 20 to 150 Å.

4. The method as claimed in claim 3, wherein the thickness of the amorphous silicon layer is 75 angstroms.

5. The method as claimed in claim 1, wherein in said step (c) the thermal oxidation is performed at a temperature of 800° C. to 1000° C. in a dry O$_2$ ambient.

6. The method as claimed in claim 5, wherein the thermal oxidation is conducted at a temperature of 900° C.

7. The method as claimed in claim 1, wherein in step (d) the thickness of the polysilicon layer is in the range of 300 nm to 400 nm.

* * * * *